United States Patent

Kogure et al.

[11] Patent Number: 5,971,836
[45] Date of Patent: Oct. 26, 1999

[54] GRINDING MACHINE

[75] Inventors: Toshiharu Kogure; Katsura Tomotaki, both of Narashino; Yoshikazu Kojima; Jun Osanai, both of Chiba, all of Japan

[73] Assignee: Seiko Seiki Kabushiki Kaisha, Japan

[21] Appl. No.: 08/520,379

[22] Filed: Aug. 29, 1995

[30] Foreign Application Priority Data

| Aug. 30, 1994 | [JP] | Japan | 6-205714 |
| Sep. 28, 1994 | [JP] | Japan | 6-233874 |
| May 29, 1995 | [JP] | Japan | 7-130512 |
| Aug. 4, 1995 | [JP] | Japan | 7-200016 |

[51] Int. Cl.$^6$ ................................. B24B 7/02
[52] U.S. Cl. .................. 451/41; 451/5; 451/63; 451/123; 451/242; 451/246
[58] Field of Search ................ 451/225, 41–44, 451/119, 120, 123, 155, 242, 245, 246, 49, 11, 5, 1

[56] References Cited

U.S. PATENT DOCUMENTS

| 5,027,280 | 6/1991 | Ando et al. | 364/474.16 |
| 5,035,087 | 7/1991 | Nishiguchi et al. | 451/285 |
| 5,099,618 | 3/1992 | Schmid | 451/63 |
| 5,185,965 | 2/1993 | Ozaki | 451/63 |
| 5,562,528 | 10/1996 | Ueyama et al. | 451/11 |

*Primary Examiner*—Robert A. Rose
*Assistant Examiner*—George Nguyen
*Attorney, Agent, or Firm*—Adams & Wilks

[57] ABSTRACT

A grinding machine comprises a grinding member having a thickness greater than 10 mm and an outer contact surface extending in a thickness direction of the grinding member for contacting a surface of a workpiece. The grinding member is supported by a first rotational shaft for rotation about a first rotational axis. A first moving mechanism reciprocates the first rotational shaft along a first displacement axis. The workpiece is supported by a second rotational shaft for rotation about a second rotational axis perpendicular to the first displacement axis and the first rotational axis. A second moving mechanism moves at least one of the workpiece and the grinding member along a second displacement axis to bring the outer contact surface of the grinding member into linear contact with the surface of the workpiece to grind the workpiece. The linear contact between the outer contact surface of the grinding member and the surface of the workpiece has a contact length greater than 10 mm.

29 Claims, 14 Drawing Sheets

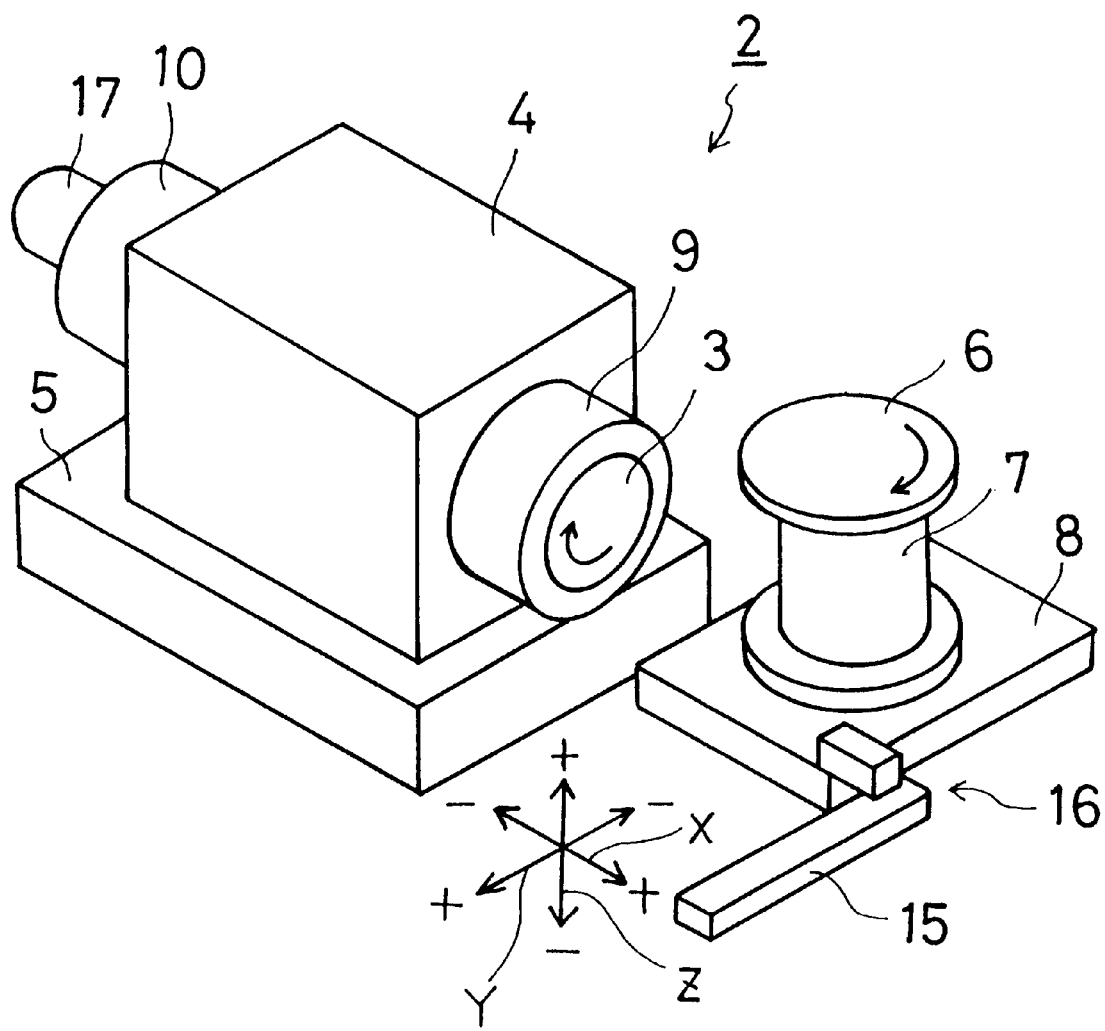
F I G. 3

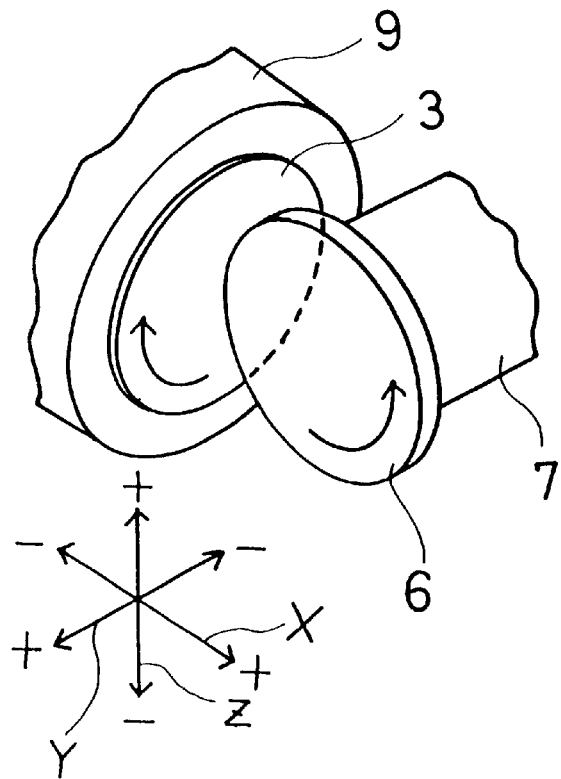
F I G. 5
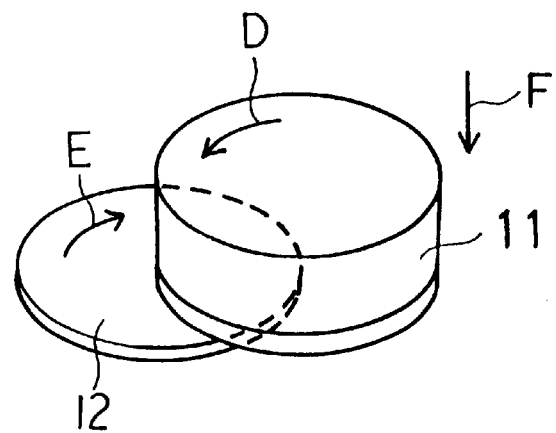
F I G. 6

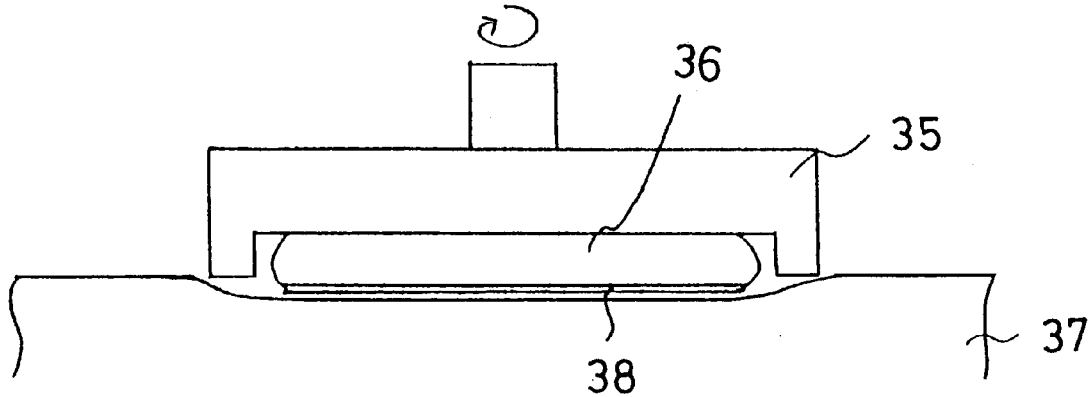
F I G. 9
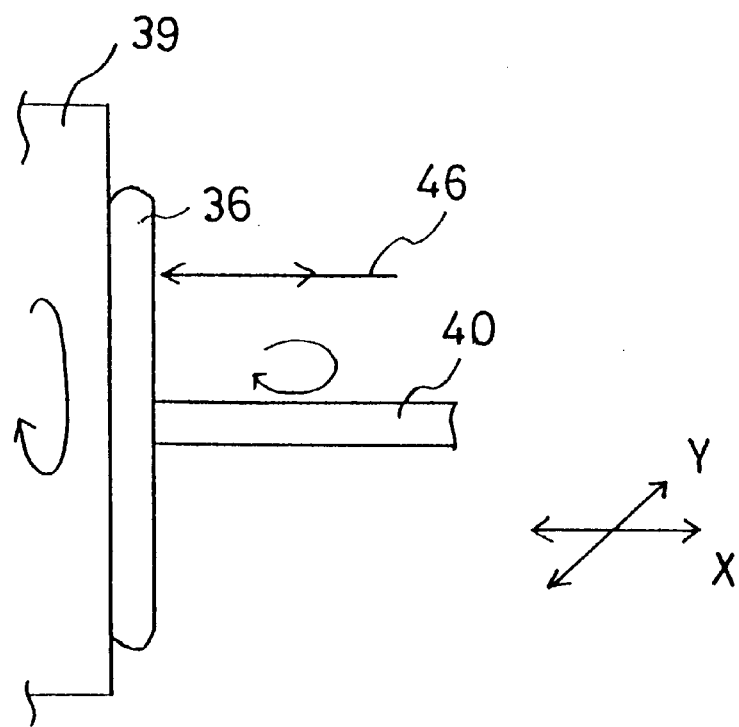
F I G. 1 0

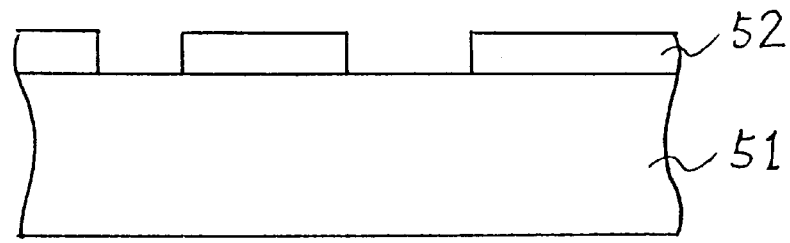
F I G. 1 2 A
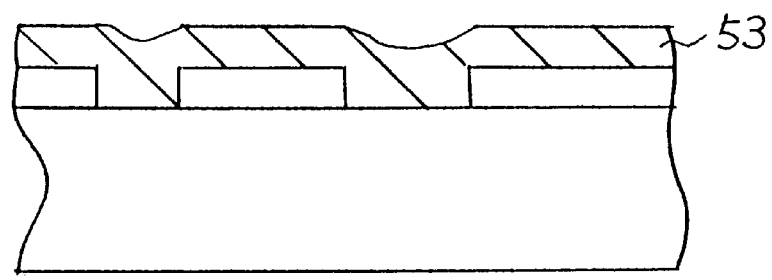
F I G. 1 2 B
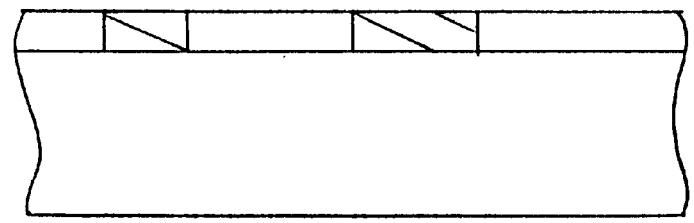
F I G. 1 2 C

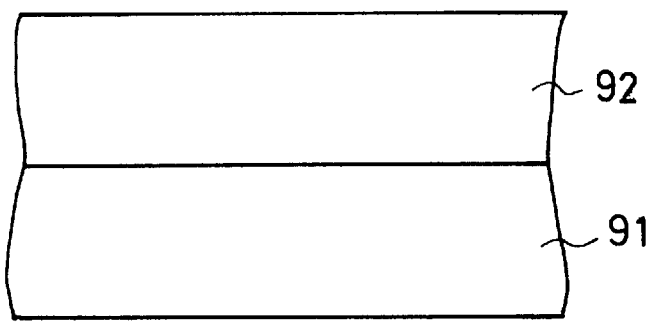
F I G. 1 8 A
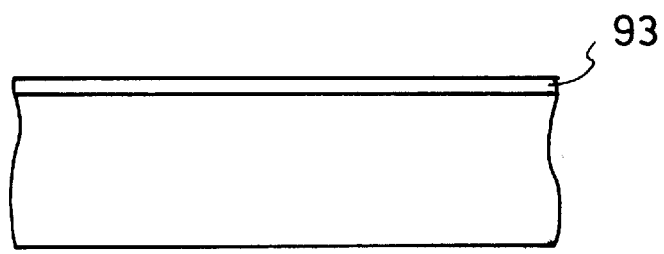
F I G. 1 8 B
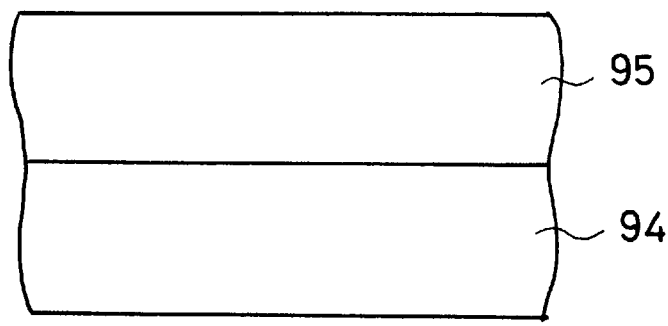
F I G. 1 9 A
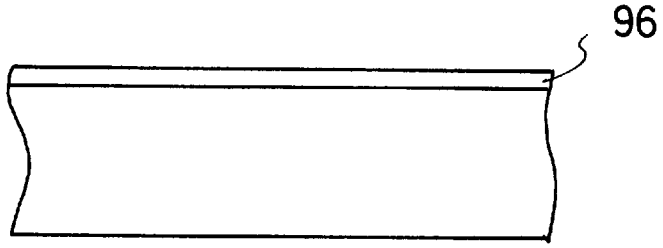
F I G. 1 9 B

GRINDING MACHINE

BACKGROUND OF THE INVENTION

The present invention relates to a grinding machine, a grinding method, a method of fabricating semiconductor devices, and a method of fabricating semiconductor thin-film substrates. For example, the invention relates to a grinding machine for grinding surfaces of semiconductor wafers, to a method of grinding surfaces of semiconductor wafers, to a method of fabricating semiconductor devices by making use of steps for planarizing a substrate surface and a thin film formed on the planarized substrate surface, and to a method of fabricating semiconductor thin-film substrates having a quite thin semiconductor single-crystal film for use in semiconductor integrated circuits, semiconductor devices, or display devices.

Where the surface of a desired workpiece is machined, various machines and various methods can be used, depending on the material of the workpiece, on the shape, and on the surface state to be obtained after the machining process. Where the surface of a semiconductor wafer is machined, it is common practice to employ lapping. In a lapping operation, free abrasive grains are inserted between a platen and a semiconductor wafer that is a workpiece. The platen is made to make a planetary motion relative to the workpiece while maintaining the platen in contact with the workpiece. In this way, the semiconductor wafer surface is machined.

Another machining method is grinding using a cup-shaped grinding wheel as shown in FIG. 6. When a grinding operation is performed with the cup-shaped grinding wheel, a semiconductor wafer 12 is placed opposite to the outer surface of the grinding wheel 11 in such a way that the center of rotation of the wafer 12 substantially agrees with the outer surface of the grinding wheel 11. The grinding wheel 11 and the wafer 12 are rotated in opposite directions as indicated by the arrows D and E, respectively. Under this condition, the cup-shaped grinding wheel 11 is fed into the wafer in the direction indicated by the arrow F. In this manner, the surface of the semiconductor wafer 12 is machined.

Where a curved surface such as of a lens or reflecting mirror is machined, a grinding operation is carried out, using an extremely thin grinding wheel 13 as shown in FIGS. 7A and 7B. As shown in FIG. 7B, the extremely thin grinding wheel 13 comprises an extremely thin (2 to 3 mm) disklike grinding wheel whose outer surface has been shaped like the letter "R". This grinding wheel 13 and a workpiece 16 are rotated. The grinding wheel 13 is fed into the workpiece in the direction indicated by the arrow H while reciprocating a grinding wheel shaft 14 in the direction indicated by the arrow G of FIG. 7A. In this way, the surface of the workpiece 12 is machined. In this machining process, the extremely thin grinding wheel 13 makes contact with the workpiece 12 at a point. Therefore, a desired curved surface can be obtained.

On the other hand, chemical-mechanical polishing (CMP) has attracted attention as a new planarizing technique for semiconductor fabrication processes. FIG. 9 is a cross section of a semiconductor wafer being polished, schematically illustrating the CMP technique. The silicon wafer, indicated by 36, is held to a suction platen 35 and rotated as indicated by the arrow. The wafer is kept in contact with polishing cloth 37 on the surface of a polishing machine. That is, CMP is a process making use of both mechanical processing and chemical etching to planarize the surface of the silicon wafer without damaging it. The mechanical processing utilizes both the polishing cloth 37 and a compound in the polishing fluid. The chemical etching makes use of a chemical solvent contained in the polishing fluid. Accordingly, it is necessary to select the polishing fluid according to the object to be polished. In the CMP, reaction products formed on the wafer surface are removed generally by mechanical polishing between colloidal silica and the polishing cloth and thus chemical reactions are promoted. That is, CMP processes the desired workpiece by mechanochemical reactions. For example, where the polished workpiece is silicon, NaOH which is the main constituent of the abrasive cooperates with the silicon surface layer to form a layer of the reaction product $Na_2SiO_3$, as given by the following chemical reaction:

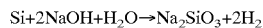

$$Si + 2NaOH + H_2O \rightarrow Na_2SiO_3 + 2H_2$$

This reaction product 38 is removed by mechanical polishing of colloidal silica (compound) and polishing cloth to expose a new silicon surface. As a result, the chemical reaction on the surface is continued. Thus, the polishing process is made to progress. The temperature at the surface of the wafer is elevated by frictional heat and so the chemical reaction is accelerated.

Some methods are known to form a single-crystal thin film in a semiconductor thin-film substrate. In one method, gas is supplied onto a crystal substrate and a single-crystal film is epitaxially grown. In another method, a thick semiconductor single-crystal substrate is bonded to a second substrate. Then, the first-mentioned semiconductor single-crystal substrate is polished to form a thin film. Also, the aforementioned chemical-mechanical polishing (CMP) has attracted attention as a new planarizing technique for semiconductor manufacturing processes.

The conventional grinding machines and methods using these conventional machines use the several methods described above. However, these have the following drawbacks.

In lapping, if the workpiece is a brittle material such as a semiconductor wafer, innumerable cracks are produced on the surface of the workpiece because of brittle fracture, leaving a deep layer whose property has been modified by the processing. Therefore, it has been heretofore necessary to etch away the modified layer with an acid or the like after the lapping.

Furthermore, the cracks produced by the lapping have nonuniform depths. This increases the amount of the modified layer to be etched away. This in turn greatly deteriorates the flatness. Accordingly, after the etching step, polishing is necessary to modify the shape. In this way, the efficiency of the machining process is quite low. Moreover, the planetary motion makes the machine bulky.

In addition, in the case of grinding using the cup-shaped grinding wheel, the cup-shaped grinding wheel 11 provides a large area in contact with the workpiece 12 such as a semiconductor wafer, as shown in FIG. 6. Hence, the machining load is large. Therefore, in order to improve the accuracy of the shape, it is necessary to enhance the rigidity. This also increases the size of the machine. Further, if the contact area between the cup-shaped grinding wheel 11 and the workpiece 12 is large, then each individual abrasive grain makes contact with the workpiece for a long time. In consequence, the load imposed on the abrasive grain per rotation of the grinding wheel is large. As a result, abrasive grains tend to come off and to cause rapid wear. When abrasive grains come off, they are dragged on the surface of the workpiece, resulting in cracks. Furthermore, abrasive dust is not efficiently removed, so that the dust is dragged. This also leads to cracks.

In machining processes using the extremely thin grinding wheel 13 shown in FIG. 7, the grinding wheel 13 provides a small area in contact with the workpiece 12 such as a semiconductor wafer. Hence, the machining efficiency is very low. Furthermore, the grinding wheel makes contact with the workpiece at a point and so it is necessary to very accurately align the center position (machined point) of the grinding wheel 13 indicated by the dot-and-dash line P in FIG. 7B with the position of the center of rotation of the workpiece indicated by the phantom line Q. However, if the center position of the grinding wheel 13 slightly deviates from the center of rotation of the workpiece, then some part of the central portion of the workpiece will be left unground.

Where CMP is applied to semiconductor device fabrication processes, the following problems occur.

(1) Where a large area is machined by CMP, the central portion is dished out. Therefore, the surface of the semiconductor thin-film substrate has unevenness on the order of 0.5 $\mu$m.

(2) The abrasive used in CMP machining is an alkali solution such as NaOH or KOH containing colloidal silica or the like. Therefore, the abrasive or its reaction products are left on the wafer surface. The remaining abrasive or reaction products deteriorate the device characteristics or production yield.

(3) In the case of CMP machining, the whole wafer surface is machined. Therefore, it is difficult to detect the endpoint of the machining process. This makes it impossible to accurately control the film thickness.

(4) Since a chemical etching is conducted, it is necessary to select the abrasive according to the object to be polished.

When a single-crystal film is epitaxially grown for fabrication of a semiconductor thin-film substrate, the following problems occur:

(1) The underlying substrate must be a crystal. Furthermore, this is limited to substrates having lattice constants substantially equal to that of the epitaxially grown thin film.

(2) A high temperature exceeding about 1000° C. is necessary for the epitaxial growth. Lowering the temperature deteriorates the crystallinity.

(3) When the film is epitaxially grown, anomalous growth is observed in some portions. This makes it impossible to achieve a uniform film over the whole substrate.

Further, where a semiconductor thin-film substrate is formed by CMP machining, the same drawbacks are produced as occurring when CMP machining is applied to the aforementioned semiconductor device fabrication method.

SUMMARY OF THE INVENTION

Accordingly, it is an object of the present invention to provide a grinding machine which is free of the foregoing problems and capable of performing a grinding operation in such a way that a layer of a modified property is less produced, without involving increase of size of the machine or decrease of machining efficiency.

It is another object of the invention to provide a grinding method of grinding a workpiece in such a way that a layer of a modified property is less produced.

It is a further object of the invention to provide a method of fabricating semiconductor devices, using a grinding method adapted for semiconductor fabrication processes.

It is a yet other object of the invention to provide a method of fabricating a semiconductor single-crystal thin-film substrate which is quite thin, has excellent crystallinity, and has less unevenness.

A grinding machine which achieves the above-described objects in accordance with the present invention comprises: a cylindrical grinding wheel having a thickness of more than 10 mm; a grinding wheel shaft for rotating the cylindrical grinding wheel about an axis of rotation; a grinding wheel-moving means for reciprocating the grinding wheel shaft in a direction; a main spindle for rotating a disklike workpiece about an axis of rotation perpendicular to the direction of reciprocation and also to the axis of rotation of said cylindrical grinding wheel; and an infeed means for moving at least one of said workpiece and said cylindrical grinding wheel so that said cylindrical grinding wheel is fed into said workpiece.

A grinding method which achieves the above-described objects in accordance with the present invention comprises the steps of: rotating a cylindrical grinding wheel having a thickness of more than 10 mm about a grinding wheel shaft; clamping a disklike workpiece to a support base; bringing a surface of said workpiece into contact with a curved side surface of said cylindrical grinding wheel; rotating said support base to rotate said workpiece; and moving contact portions of said workpiece and said cylindrical grinding wheel relative to each other in two dimensions along the surface of said workpiece to cut the surface of said workpiece.

A semiconductor device fabrication method which achieves the above-described objects in accordance with the present invention comprises the steps of: preparing a substrate of a semiconductor or an insulator or a substrate having a thin film formed on a surface of said substrate; patterning the surface of the substrate by a photoetching method to make the surface uneven; forming a thin film on the uneven surface of the substrate such that surface of the thin film at recessed portions of the surface of the substrate is higher than convex portions of the surface of the substrate; and grinding each individual portion of the thin film successively at least up to depth of said recessed portions of the thin film only by mechanical means over the whole surface of the thin film.

A semiconductor thin-film device fabrication method which achieves the above-described objects in accordance with the present invention comprises the steps of: preparing a first substrate; adhesively bonding a second substrate made from a single-crystal semiconductor material to said first substrate; machining said second thin film into a semiconductor thin film by mechanical means, leaving behind a layer modified in quality by the machining; removing the surface of said semiconductor thin film to a depth of 0.05 to 0.3 $\mu$m so as to remove the modified layer; and planarizing the uneven surface of the semiconductor thin film.

In the grinding machine constructed as described above, the cylindrical grinding wheel having a thickness of more than 10 mm is rotated by the grinding wheel shaft, which is in turn reciprocated by the grinding wheel-moving means. The main spindle rotates a disklike workpiece about the axis of rotation which is perpendicular to the direction of reciprocating motions of the grinding wheel shaft and also to the axis of rotation of the cylindrical grinding wheel. The infeed means moves at least one of the workpiece and the cylindrical grinding wheel so that the grinding wheel is fed into the workpiece. In this way, the workpiece is ground.

In the novel grinding method, contact portions of the workpiece and the cylindrical grinding wheel having a thickness of more than 10 mm are moved relative to each other in two dimensions along the surface of the workpiece, thus cutting the surface of the workpiece. In this manner, two conflicting objects (i.e., decrease of the machining load and the improvement of the machining efficiency) can be well struck.

In the novel semiconductor device fabrication method, at the planarizing step, each individual portion of the flat plane of the workpiece to be processed is successively ground away by mechanical means alone. In this way, the whole surface of the workpiece is ground. Since this process utilizes the mechanical means, no chemical products are produced. Furthermore, the grinding step does not depend heavily on the material of the workpiece. Since the whole surface of the substrate is not simultaneously ground, the grinding processing can be performed while monitoring the film thickness obtained after the grinding.

In the novel semiconductor thin-film device fabrication method, at the planarizing step, each individual portion of the flat plane of the workpiece to be processed is successively ground away by mechanical means alone, thus machining the whole surface of the workpiece. In consequence, no chemical products are generated. Furthermore, the grinding step does not depend materially on the material of the workpiece. Since the whole surface of the substrate is not simultaneously ground, the grinding processing can be performed while monitoring the film thickness obtained after the grinding. In addition, the thickness of the layer modified in property by the machining can be suppressed to about 0.1 $\mu$m, because the mechanical load is small.

Other objects and features of the invention will appear in the course of the description thereof, which follows.

BRIEF DESCRIPTION OF THE DRAWINGS

FIG. 3 is a perspective view of a grinding machine according to a second example of the present invention;

FIG. 5 is a fragmentary perspective view of a modification of the grinding machines according to the first and second examples;

FIG. 6 is a perspective view illustrating one known grinding process;

FIG. 9 is a fragmentary cross section of a grinding machine, illustrating the prior art chemical-mechanical polishing method;

FIG. 10 is a fragmentary cross section of a grinding machine, illustrating a mechanical grinding method applied to the present invention;

FIGS. 12A–12C are cross-sectional views of dissimilar metal interconnection semiconductor devices according to a fifth example of the invention, illustrating the process sequence;

FIGS. 18A–18B are cross-sectional views of semiconductor thin-film substrates according to a ninth example of the invention, illustrating the process sequence; and FIGS. 19A–19B are cross-sectional views of semiconductor thin-film substrates according to a tenth example of the invention, illustrating the process sequence.

DETAILED DESCRIPTION OF THE PREFERRED EMBODIMENTS

Examples of the present invention are hereinafter described in detail with reference to FIGS. 1–18.

Figure 1:
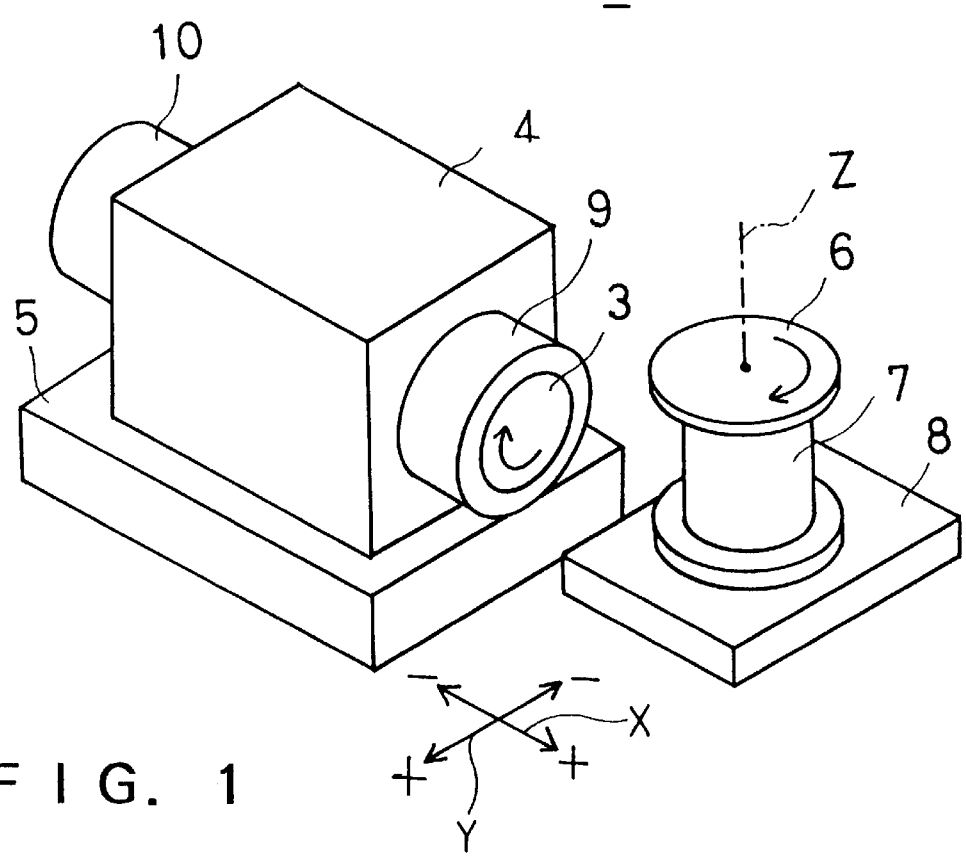
FIG. 1 is a perspective view of a grinding machine according to a first example of the present invention.

FIG. 1 shows a grinding machine according to a first example of the invention. The grinding machine, generally indicated by reference numeral 1, comprises a rotational member or main spindle 4 for rotating a disklike workpiece 3 about a rotational axis B and a headstock 5 to which the spindle 4 is fixedly attached. In the present example, a semiconductor wafer is machined as the workpiece 3, as an example. This workpiece 3 is firmly held to the spindle 4 by a chuck 9. The spindle 4 is rotated by an electric motor 10. The headstock 5 is moved in the X-axis direction as viewed in FIG. 1 by a driving means (not shown) including a moving mechanism such as a ball screw or a servomotor for driving the ball screw.

The grinding machine 1 is further equipped with a disklike thin grinding member or wheel 6, a rotational member or grinding wheel shaft 7 for rotating the grinding wheel 6 about the Z-axis, and a grinding wheel head 8 to which the shaft 7 is securely mounted. The grinding wheel shaft 7 is rotated by an electric motor (not shown). The grinding wheel head 8 is reciprocated in the Y-axis direction perpendicular to the X-axis direction by a driving means including a moving mechanism (not shown) such as a ball screw or servomotor.

Figure 2:
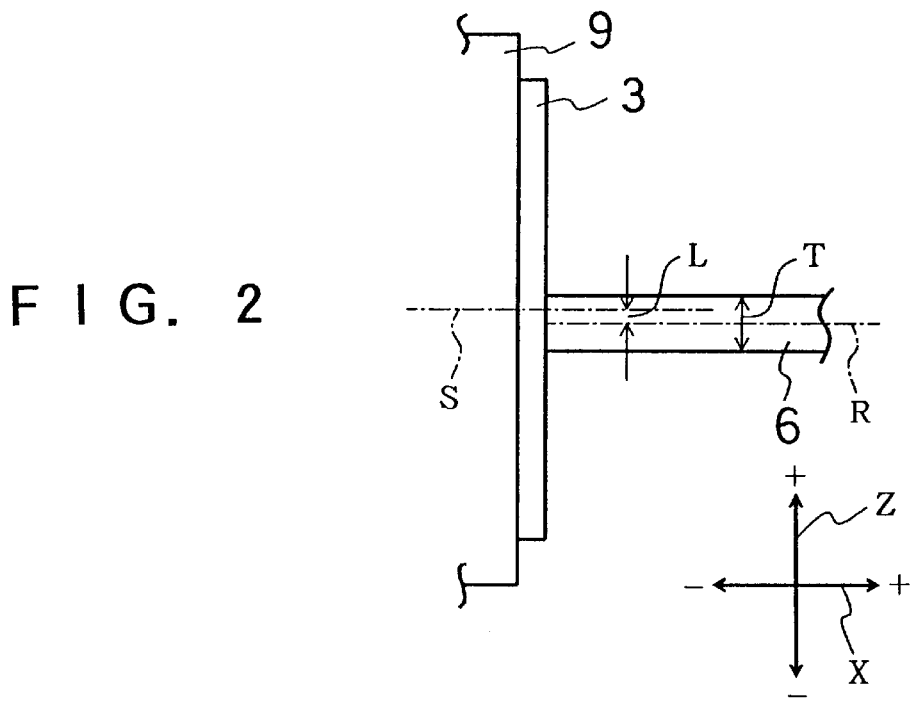
FIG. 2 is a diagram of the grinding wheel of the grinding machine shown in FIG. 1, showing the manner in which the wheel is in contact with a workpiece.

FIG. 2 illustrates the positional relation between the grinding wheel 6 and the workpiece 3. When the headstock has been moved in the positive direction of the X-axis by the driving means (not shown), the workpiece 3 is in a position where a surface 3a thereof contacts an outer contact surface or periphery of the grinding wheel 6. When the grinding wheel 6 is rotating, the center line R in the direction of thickness (in the Z-axis direction) of the grinding wheel 6 is spaced a distance of L from the center of rotation of the workpiece indicated by the line S. The distance L is less than half the thickness T of the grinding wheel 6. That is, L≦T/2. The grinding wheel 6 may also be disposed at the height (L=0) where the center line R agrees with the line S.

In the present example, the thickness T of the grinding wheel 6 corresponds to the size of one chip of semiconductor wafer, i.e., 15 to 20 mm. It is to be noted that the thickness is exaggerated in FIGS. 1 and 2. The operation of the example constructed in this way is described below.

First, the main spindle 4 is driven by the motor 10, so that the workpiece 3 is rotated. Also, the grinding wheel 6 is rotated together with the grinding wheel shaft 7 by the motor (not shown). The grinding wheel head 8 is moved back and forth in the Y-axis direction by the driving means (not shown) such as a ball screw. The headstock 5 is moved in the positive direction of the X-axis by the driving means (not shown). Thus, the rotating workpiece 3 is brought into contact with the reciprocating grinding wheel 6 on a line. The surface of the workpiece 3 is ground with an amount of infeed corresponding to the distance traveled by the headstock 5 in the positive direction of the X-axis.

In the present example, the workpiece 3 is ground by the linear contact at a width of 15 to 20 mm which is the thickness of the grinding wheel 6. Therefore, the machining load is smaller than the machining load imposed when a grinding operation is performed with a two-dimensional contact, for example, using a cup-shaped grinding wheel. Consequently, the rigidity of the machine can be reduced. This permits a reduction in size of the machine. However, the grinding wheel provides a larger area in contact with the workpiece than in the case of a grinding operation using the prior art extremely thin grinding wheel 13 (FIGS. 7A and 7B) and utilizing a point contact. In consequence, the machining efficiency is higher.

Normally, where the width (thickness) of the grinding wheel 6 is less than 10 mm, the machining efficiency is very poor. Where the width is greater than 20 mm, the machining load is increased. This increases the size of the machine and presents other problems. In the present example, the width of the grinding wheel 6 is set to 15 to 20 mm and so these two conflicting requirements, i.e., lower machining load and higher machining efficiency, can be well struck. Furthermore, the width of the grinding wheel 6 is made to correspond to the size of one chip of semiconductor wafer. Therefore, the workpiece 3 can be ground in such a way that the grinding wheel 6 leaves no grooves on the chip, by taking account of the positions of plural chips and the grinding trajectory of the grinding wheel 6 on the workpiece 3.

Furthermore, since the grinding wheel 6 contacts the workpiece 3 only locally, the machining accuracy is not materially affected by the shape accuracy of the grinding wheel 6. In the case of a wide cylindrical grinding wheel of high hardness, it has been necessary to strictly true the profile of the wheel. In the present example, the grinding wheel 6 can easily obtain a high degree of flatness without involving such cumbersome operation.

In addition, in the present example, each individual abrasive grain of the grinding wheel 6 touches the workpiece for a short time and so abrasive dust can be easily removed. Consequently, cracks which would have been produced when the abrasive dust is dragged are prevented.

For the same amount of infeed, the abrasive grains of the grinding wheel 6 are fed into the workpiece at a smaller angle than in the case of grinding using the prior art cup-shaped grinding wheel (FIG. 6). Therefore, the amount of interference between the grinding wheel 6 and the workpiece 3 can be readily made smaller than the ductility-brittleness transition point. Consequently, where a workpiece such as a semiconductor wafer made from a brittle material is machined, it can be ground without causing brittle fracture.

In the present example, the direction of reciprocating motions of the grinding wheel 6 (Y-axis direction) is perpendicular to the direction of the thickness (Z-axis direction). Therefore, even if the position in the direction of thickness of the grinding wheel 6 slightly deviates from the center (line S) of the workpiece 3 ($L \leq T/2$), the central portion of the workpiece 3 is not left unground at all. Consequently, the position of the grinding wheel 6 is not required to be set strictly. Thus, it is easy to mount the machine, and a hard grinding wheel can be used.

Also in the present example, the center position of the grinding wheel 6 (indicated by the line R of FIG. 2) deviates from the center of rotation of the workpiece 3 (indicated by the line S). Therefore, the machining width is made substantially greater than the machining width obtained when the grinding wheel 6 is positioned in a location where the lines R and S agree. Hence, the machining efficiency is higher. In the present invention, the wafer is moved in the X-axis direction. The grinding wheel is reciprocated in the Z-axis direction. The wafer and the grinding wheel may be moved in any desired direction as long as infeed and reciprocating motions are made between them.

A grinding machine according to a second example of the invention is next described. It is to be noted that like components are indicated by like reference numerals in various figures and that those components which have been already described in connection with the first example may not be described in detail below.

Referring to FIG. 3, there is shown a grinding machine according to the second example. This grinding machine, generally indicated by reference numeral 2, comprises a position measuring device 16 and a rotary encoder 17 for detecting the angular position of the main spindle 4. The position measuring device 16 measures the position of the grinding wheel head 8 in the Y-axis direction relative to a scale 15 firmly mounted to the stationary portion of the machine. This machine is similar in mechanical structure to the first example in other respects.

Figure 4:
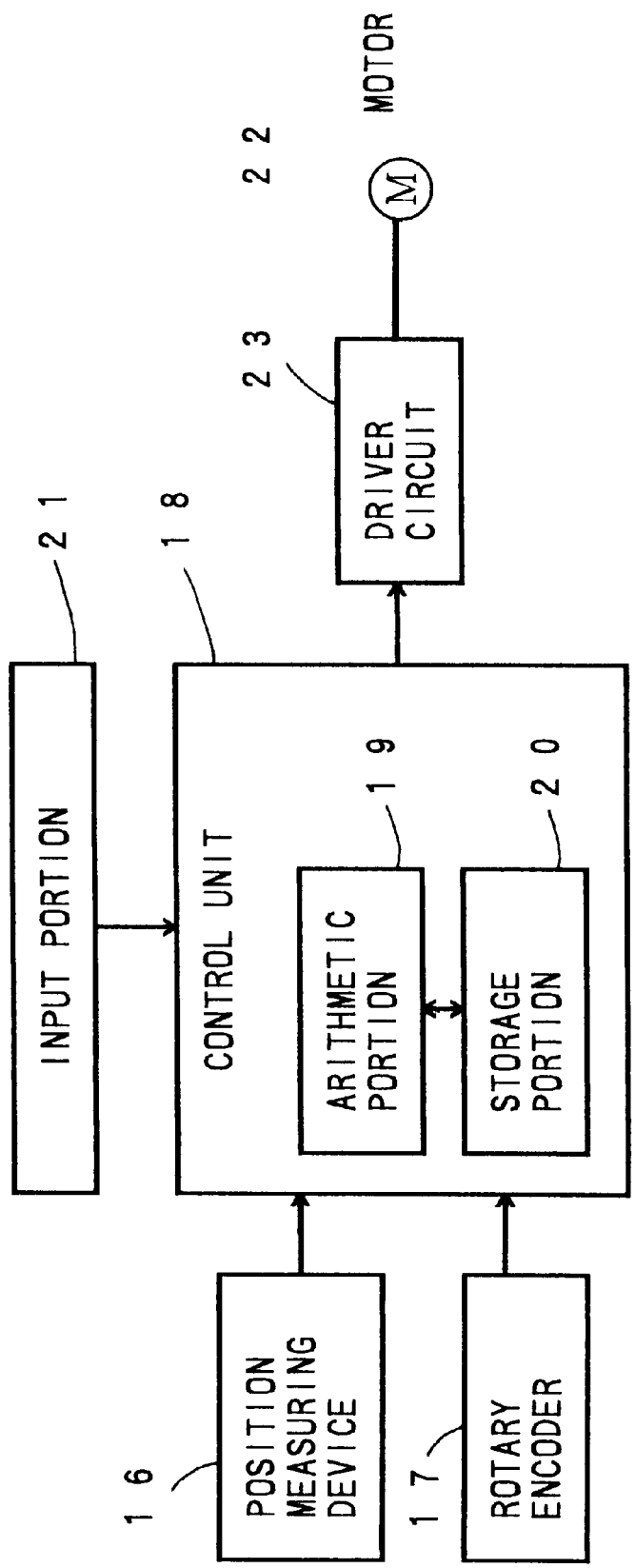
FIG. 4 is a block diagram of parts of the control system of the grinding machine shown in FIG. 3.
Figure 7A:
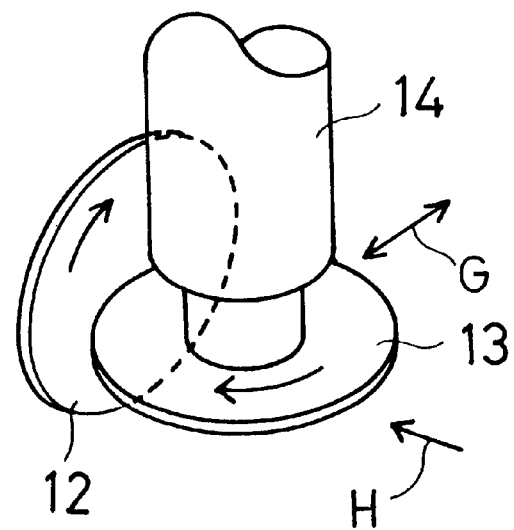
FIGS. 7A and 7B are a perspective view illustrating another known grinding process.
Figure 7B:
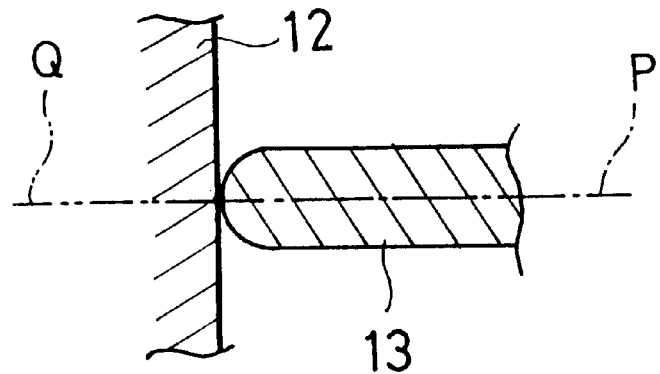

FIG. 4 shows parts of the control system of the grinding machine 2. The grinding machine 2 is equipped with a control unit 18 for controlling the various driving portions. The control unit 18 comprises an arithmetic portion 19 and a storage portion 20 for storing the diameter of the grinding wheel 6, data about the profile of the workpiece 3, and other data. The arithmetic portion 19 performs calculations from values obtained by the position measuring device 16 and from values measured by the rotary encoder 17.

The data about the profile of the workpiece 3 is obtained by taking coordinates on the surface of the workpiece 3 and measuring the unevenness at each coordinate. The measurement is made by using an external profile measuring instrument (not shown) before the workpiece is attached to the chuck 9. Data obtained by the measurement is entered from an input portion 21 and stored in the storage portion 20.

A driver circuit 23 for controlling the operation of an electric motor 22 is connected with the arithmetic portion 19, the motor 22 acting to move the headstock 5 in the X-axis direction. The amount of movement of the headstock 5, i.e., the amount of infeed of the grinding wheel 6 into the workpiece 3, is controlled by supplying desired signals to the driver circuit 23.

The arithmetic portion 19 also serves to determine the coordinates on the workpiece 3 with which the grinding wheel 6 is in contact, from output signals from the position measuring device 16 and from the rotary encoder 17, and to give an amount of infeed corresponding to the shape at these coordinates to the driver circuit 23 according to the data about the profile of the workpiece 3 and other parameters, the data being stored in the storage portion 20.

In the present example, the arithmetic portion 19 controls the infeed of the grinding wheel 6 according to the shape data which is stored in the storage portion 20 to modify the shape of the workpiece 3. The operation of the example constructed in this way is described now.

First, the workpiece 3 is installed on the main spindle 4 at a given angle. In the same way as in the first example, the grinding wheel 6 and the workpiece 3 are rotated. The grinding wheel head 8 is reciprocated in the Y-axis direction.

At this time, the arithmetic portion 19 recognizes the position of the outer periphery of the grinding wheel 6 in contact with the workpiece 3 from the data about the diameter of the grinding wheel 6 and from the output signal from the position measuring device 16, the data being stored in the storage portion 20. Furthermore, the arithmetic portion 19 recognizes the angular position of the workpiece 3 from the output signal from the rotary encoder 17 and from the orientation of the workpiece 3 relative to the main spindle 4. Then, the arithmetic portion 19 calculates the coordinate on the workpiece 3 with which the grinding wheel 6 is in contact, from some kinds of data including the recognized position of the grinding wheel 6, the angular position of the workpiece 3, and the information about the coordinates on the workpiece 3, the data being stored in the storage portion 20.

After computing the position on the workpiece 3 at which it touches the grinding wheel 6, the arithmetic portion 19 reads data regarding the position (coordinates) of the contact from the storage portion 20. Since the unevenness at the contact position indicated by the data about the shape corresponds to the amount of amendment to the shape, the arithmetic portion 19 supplies the unevenness as an amount of infeed to the driver circuit 23, the unevenness being indicated by the shape data which is the amount of amendment.

In this way, the headstock 5 is caused to move a distance in the X-axis direction, the distance corresponding to the unevenness of the workpiece 3 at the position where it touches the grinding wheel 6. The grinding wheel 6 is fed into the workpiece 3 by an amount corresponding to the moved distance. That is, the shape of the workpiece 3 at the position where it contacts the grinding wheel 6 is modified.

In the present example, the arithmetic portion 19 performs the processing described thus far on a real-time basis according to variations in the angular position of the workpiece 3 and according to variations in the position of the grinding wheel 6. In this way, the whole surface of the workpiece 3 is modified. As described thus far, in the present example, errors in the circumferential direction of the grinding wheel 6 and errors involved in the headstock 5 can be corrected.

In the second example, the position of the grinding wheel head 8 is measured by the position measuring device 16. Alternatively, the position of the grinding wheel head 8 may be measured by attaching a rotary encoder to the servomotor (not shown) for moving the grinding wheel head 8 in the Y-axis direction. In the examples described thus far, the direction of the axis of rotation of the grinding wheel 6 is taken to be vertical to the direction of reciprocation (Y-axis direction) of the grinding wheel head 8. As shown in FIG. 5, the direction of the axis of rotation of the grinding wheel 6 may also be made coincident with the direction of reciprocation of the grinding wheel head 8.

Furthermore, in the examples described thus far, the headstock 5 is moved by the driving means (not shown) such as a ball screw so that the grinding wheel 6 is fed into the workpiece. The infeed operation may also be carried out by using a control type magnetic bearing as the thrust bearing of the headstock 5 and varying the position at which the shaft is held by the magnetic bearing in the X-axis direction. The magnetic bearing floats and holds the shaft by the magnetic force of an electromagnet. In a further modification, a control type magnetic bearing is used as the radial bearing of the grinding wheel shaft 7. The grinding wheel 6 is moved in the X-axis direction by changing the position at which the shaft is held. In this way, the grinding wheel is fed into the workpiece 3.

With the magnetic bearing, the shaft can be moved in minute steps of 0.01 μm. Therefore, the infeed can be controlled quite accurately by using a magnetic bearing either in the spindle 4 or in the grinding wheel shaft 7. A machining operation can be readily performed in the ductile mode.

The novel grinding method has been described in detail in the description of each example of the grinding machine and so detailed description of the novel grinding method is omitted below.

An example of method of fabricating semiconductor devices according to the present invention is next described by referring to the accompanying drawings.

FIGS. 8A–8D are cross-sectional views of semiconductor devices according to a third example of the invention, illustrating the process sequence. In the third example, the novel semiconduct or device fabrication method is applied to dielectrically isolated semiconductor devices. First, a silicon-on-insulator (SOI) substrate comprising a silicon substrate 31 on which a silicon oxide film 32 and a single-crystal silicon film 33 are formed is created. Where the single-crystal silicon film is more than 3 μm thick, the SOI substrate can be formed by oxidizing the surface of the silicon substrate so as to form a silicon oxide film, bonding a second silicon substrate to the surface of the silicon oxide film via adhesive, and grinding the second substrate.

Generally, in order to reduce the film thickness variation below 0.1 μm irrespective of the silicon single-crystal film thickness, a special machining method is necessary.

FIG. 10 is a fragmentary enlarged cross section, showing the manner in which a workpiece is ground. A wafer 36 is clamped to a wafer support base 39 and rotated. Then, a disklike grinding wheel 40 having a thickness of 1 to 2 cm is rotated. Subsequently, the wheel is fed quite slightly into the X-axis direction. A grinding operation is performed while reciprocating the wheel in the Y-axis direction. During this grinding operation, the grinding wheel 40 provides a line in contact with the wafer 36. Also, during the grinding operation, a grinding fluid is passed at least between the workpiece and the grinding wheel, for cooling and for removal of the abrasive dust. The grinding fluid does not chemically etch the workpiece and can be water. That is, in the novel grinding method, the workpiece is ground by mechanical means alone. The grinding wheel 40 momentarily provides a line in contact with the machined silicon wafer. The partial grinding by this linear contact is extended to the whole wafer by rotary motion of the wafer and by reciprocating motion of the grinding wheel table (not shown). That is, the whole wafer is scanned. In this method, the grinding fluid performing no chemical etching action is used. Of course, the grinding fluid produces no chemical reactions.

Furthermore, this method is a mechanical process utilizing a cylindrical grinding wheel. Therefore, the abrasive dust produced by the abrasive grains assumes the form indicated by 76 in FIG. 15. At this time, the abrasive dust is thinnest on the surface 77 machined by the abrasive grains. For this reason, the damage to the workpiece is small. Furthermore, during the grinding process, the grinding wheel provides a line in contact with the silicon at a width of 1 to 2 cm of the grinding wheel. Therefore, the machining load is small. The flexure of the mechanical system can be suppressed. Consequently, the established amount of infeed agrees with the actual amount of infeed. Thus, the dimensional variation caused by the grinding can be reduced to a minimum. Accordingly, if the infeed is done within 0.05 μm, then the dimensional variation can be suppressed below ±0.05 μm. Hence, a very thin SOI substrate can be formed.

Figure 8A:
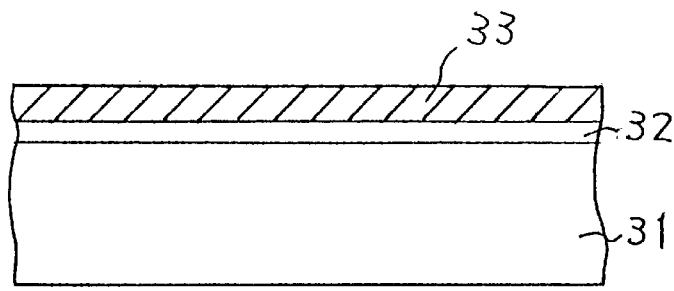
FIGS. 8A–8D are cross-sectional views of dielectrically isolated semiconductor devices according to a third example of the invention, illustrating the process sequence.
Figure 8B:
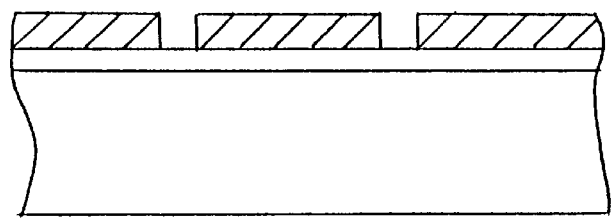

Then, as shown in FIG. 8B, the single-crystal silicon film 33 is patterned to partially expose the silicon oxide film 32. The width of the windows formed in the single-crystal silicon film 33 is the width of dielectric isolation. In order to pack transistors at a high density, it is desired to reduce the dielectric isolation width, or the window width, by etching the single-crystal silicon film by anisotropic etching techniques.

Figure 8C:
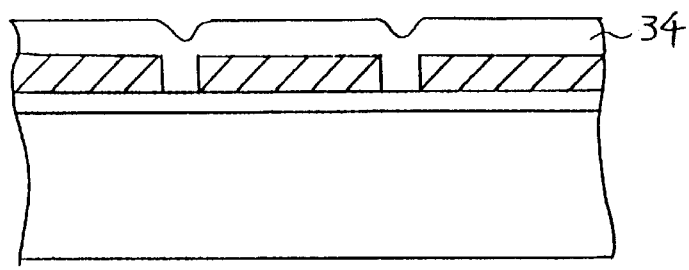

Thereafter, as shown in FIG. 8C, an isolating dielectric film 34 is formed so as to completely fill up the grooves in the single-crystal silicon film. Preferably, the dielectric film 34 is formed by low-pressure CVD or spin-coating with good step coverage. The wafer in the state shown in FIG. 8C is planarized only by mechanical grinding. That is, the dielectric film 34 is ground without using chemical etching action in the same way as the method described already in connection with FIG. 10. In the grinding method illustrated in FIG. 10, the grinding wheel provides a line in contact with the wafer during grinding. Therefore, during the grinding, the outer periphery of the wafer assumes a ground state and an unground state alternately in synchronism with the rotation of the support base 39. Accordingly, light 46 used for measurement of the film thickness is made to impinge on the wafer surface, as indicated by the arrow in FIG. 10. The reflected light is analyzed. In this way, the film thickness can be monitored. The monitored film thickness can be measured by scanning the surface, excluding the region directly ground with the grinding wheel, with the light beam.

In this way, the film thickness can be simultaneously monitored during grinding. The grinding operation can be automatically ended by designing the system so that the grinding operation ends when the monitored film thickness reaches the target value. The analysis of the reflected light used for detection of the film thickness is made, using also the period of the rotation of the support table and information about the pattern of the single-crystal silicon film. Thus, the film thickness distribution inside the wafer and the variation of the film thickness with time can be monitored. If the light beam is scanned in synchronism with the rotation of the support table, then the analysis can be easily made. The surface can be flattened accurately by grinding the surface while detecting the endpoint of the grinding.

Figure 8D:
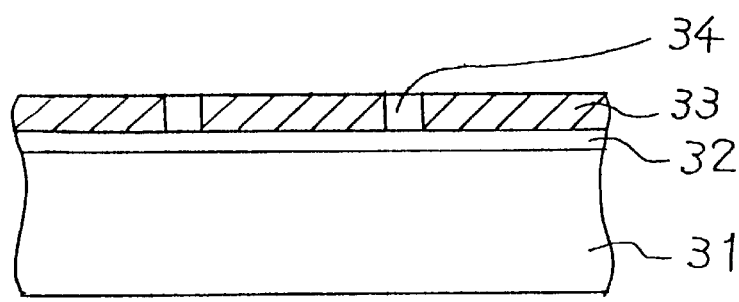

FIG. 8D is a cross-sectional view of the single-crystal silicon film shown in FIG. 8C, but in which a grinding process has been conducted up to the surface of the single-crystal silicon film. The endpoint may be so set that the etching is carried out to a point deeper than the surface of the single-crystal silicon film 33. In the present invention, the grinding method is a mechanical grinding process using a linear contact. Therefore, the central portion of the dielectric film is prevented from being dished out. Furthermore, the grinding process can be terminated under the condition that the dielectric film 34 exists on the single-crystal silicon film 33. In the present invention, the endpoint of the processing depends not on the selectivity of the workpiece utilizing chemical etching in the case of CMP but on only the control of the time of the mechanical grinding. Accordingly, the grinding process can be terminated before the surface of the single-crystal silicon film 33 appears on the surface. Transistors are formed in such a way that carrier passages are formed in the single-crystal silicon film 33 which is dielectrically isolated into islands by the dielectric film 34. In this way, semiconductor devices can be fabricated.

Manufacturing of transistors into the single-crystal silicon film 33 is performed generally after the single-crystal silicon film 33 is dielectrically isolated into islands. The transistors can also be fabricated under the condition shown in FIG. 8A. In this case, a dielectric film is formed on top of the single-crystal silicon film. During grinding, it is necessary that the grinding process do not reach the single-crystal silicon film.

Figure 11A:
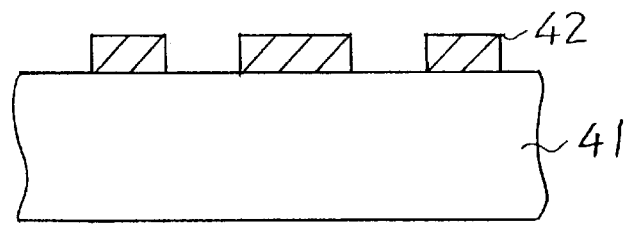
FIGS. 11A–11E are cross-sectional views of multilevel metallization semiconductor devices according to a fourth example of the invention, illustrating the process sequence.
Figure 11B:
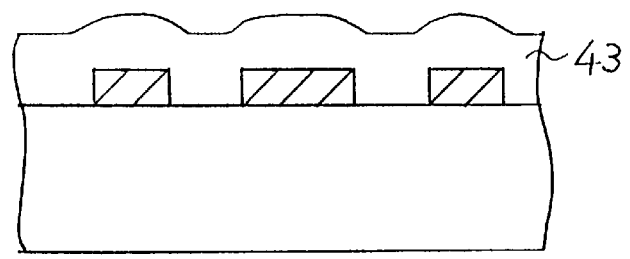
Figure 11C:
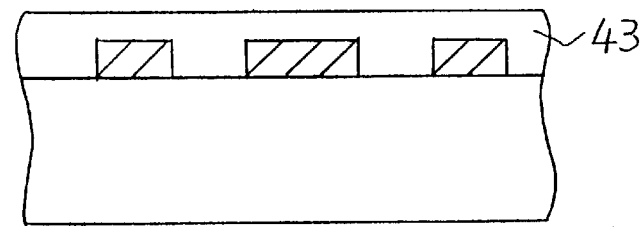
Figure 11D:
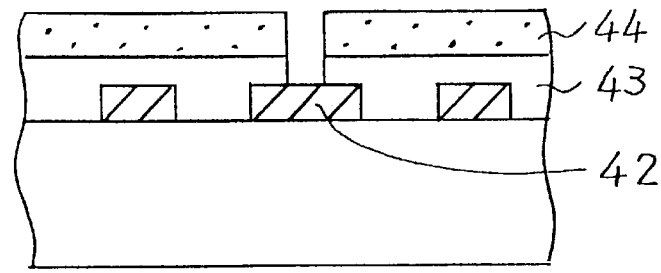
Figure 11E:
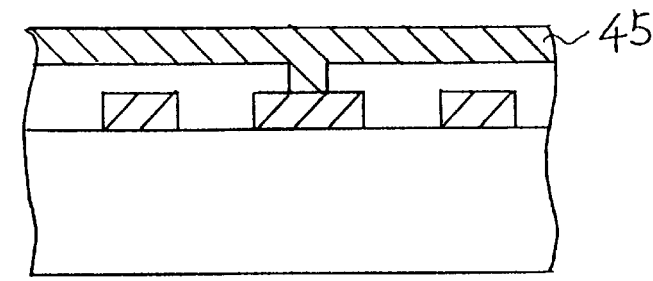

FIGS. 11A–11E are cross-sectional views of multilayer interconnection devices according to a fourth example of the present invention, illustrating the process sequence. In the fourth example, the novel semiconductor device fabrication method is applied to the multilayer interconnection semiconductor devices. First, as shown in FIG. 11A, a first metallization pattern layer 42 is formed on a substrate 41. Then, as shown in FIG. 11B, a dielectric film 43 is formed so as to completely fill up the grooves in the first metallization layer. Subsequently, th e surface of the dielectric film 43 is flattened, as shown in FIG. 11C, only by the mechanical grinding as shown in FIG. 10. In the present invention, the grinding process can be performed while monitoring the thickness of the dielectric film 43 on the metallization layer 42. Consequently, as shown in FIG. 11C, the grinding step can be terminated in such a way that the dielectric film 43 is left on the me tallization layer 42. Thereafter, as shown in FIG. 11D, contact holes are formed over the metallization layer 42, using a photoetching step making use of a resist mask 44. Then, as shown in FIG. 11E, a second metallization layer 45 is formed. This second metallization layer 45 is then patterned. In this way, multiple levels of metallization can be accomplished.

FIGS. 12A–12C are cross-sectional views of semiconductor devices, illustrating the process sequence of a fifth example of the present invention. In the fifth example, the novel semiconductor device fabrication method is applied to patterning of a metallization layer which cannot be easily chemically etched. First, as shown in FIG. 12A, a dielectric pattern film 52 is formed on a substrate 51. Then, as shown in FIG. 12B, a metallization film 53 is formed. Subsequently, as shown in FIG. 12C, the film is planarized only by the mechanical grinding shown in FIG. 10. This example is effective where the metallization material is Cu which is difficult to chemically etch. In this example, the dielectric film 52 is processed by a microelectronic technology. As a result, a high-density interconnection structure can be accomplished. Moreover, the example is effective where the metallization material is a multilayer metal film structure such as Ta/Al. Generally, where a multilayer film is etched by a chemical means, it is difficult to control the etching process. In the present invention, the workpiece is processed only by a mechanical means without using a chemical action. Consequently, it is easy to control the processing.

FIGS. 13A–13E illustrate the process sequence of a sixth example of the invention. In the sixth example, the novel semiconductor device fabrication method is applied to a method for easily fabricating ferroelectric devices by processing a ferroelectric film such as a PZT film.

Figure 13A:
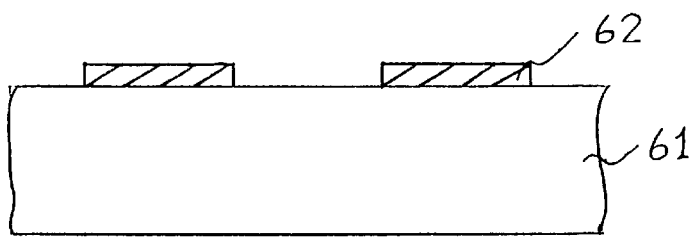
FIGS. 13A–13E are cross-sectional views of ferroelectric capacitor semiconductor devices according to a sixth example of the invention, illustrating the process sequence.
Figure 13B:
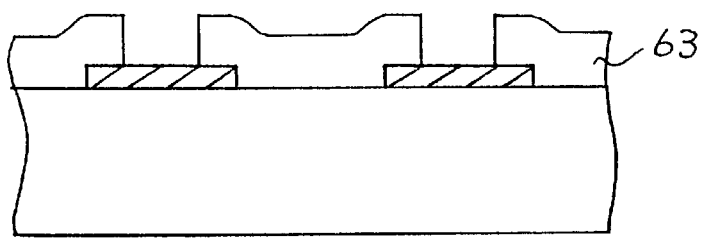
Figure 13C:
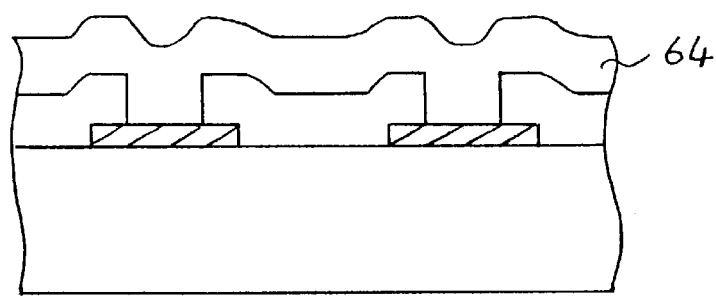
Figure 13D:
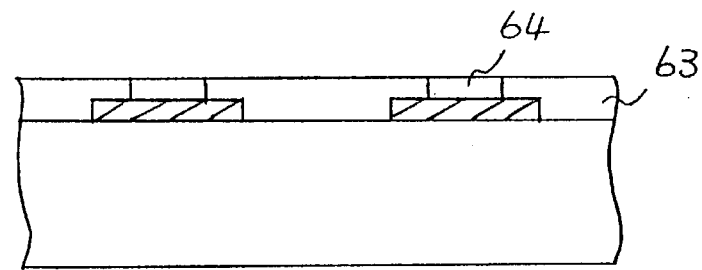
Figure 13E:
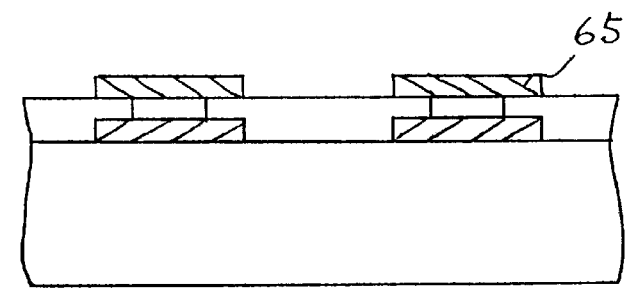

First, as shown in FIG. 13A, a base electrode pattern 62 of ferroelectric devices is formed on the surface of a substrate 61. Then, as shown in FIG. 13B, a dielectric film 63 is formed on the substrate 61 in such a way that the pattern overlying the base electrode pattern 62 has windows. Thereafter, as shown in FIG. 13C, a film 64 of a ferroelectric substance such as PZT is formed. Subsequently, as shown in FIG. 13D, the ferroelectric film 64 is flattened by mechanically grinding it such that the ferroelectric film 64 is formed over the windows in the dielectric film 63. The ferroelectric film 64 formed at the step of FIG. 13C has a thickness sufficient to produce satisfactory ferroelectric property. Generally, as the ferroelectric film thickness is increased, crystals are grown more similarly to pillars and so the ferroelectric property is improved.

Accordingly, as shown in FIG. 13C, a thick ferroelectric film is first formed to have good crystallinity. Then, the film is thinned by grinding. In this way, a ferroelectric thin film of good ferroelectric property can be obtained. The thickness obtained after polishing of the ferroelectric film can be controlled by grinding the film while monitoring the endpoint of the grinding. After planarizing the substrate surface as shown in FIG. 13D, an upper electrode pattern 65 is formed on the ferroelectric film. Thus, ferroelectric capacitors can be formed.

Figure 14A:
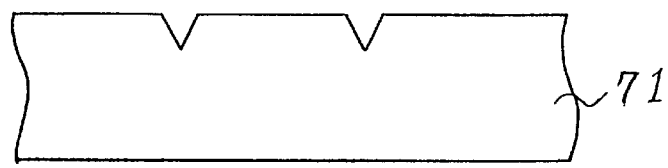
FIGS. 14A–14E are cross-sectional views of wafer-bonded semiconductor devices according to a seventh example of the invention, illustrating the process sequence.
Figure 14B:
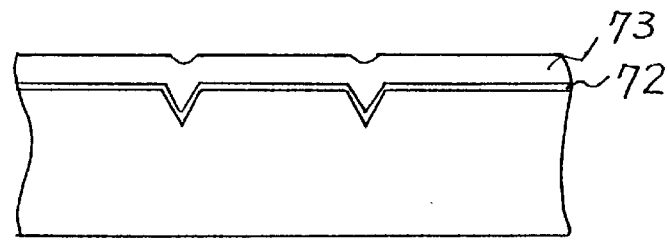
Figure 14C:
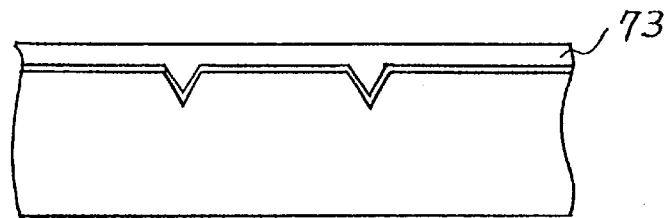
Figure 14D:
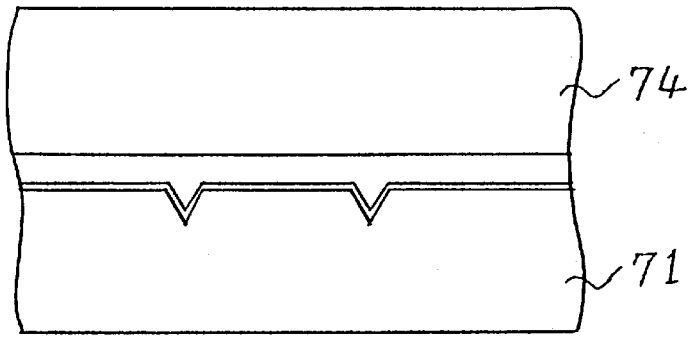

FIGS. 14A–14E are cross-sectional views of a seventh example of the present invention, illustrating the process sequence. In the seventh example, the novel semiconductor device fabrication method is applied to the case in which two dissimilar substrates are bonded together to form semiconductor devices. First, irregularities are formed on the surface of a first substrate 71. For example, if the first substrate 71 is a single-crystal silicon substrate, V-grooves can be formed by anisotropically etching the substrate with KOH solution. Then, a thermal oxide film 72 and a polysilicon film 73 are formed over the first substrate 71 having the irregularities by LPCVD, thus obtaining the structure shown in FIG. 7B. Then, as shown in FIG. 14C, the surface of the polysilicon film 73 is flattened only by mechanical grinding. The grinding operation is carried out while monitoring the thickness of the polysilicon film 73 in the same way as in other examples. Thereafter, as shown in FIG. 14D, a second substrate 74 is adhesively bonded to the surface of the polysilicon film which has been flattened as shown in FIG. 14D. This bonding operation is performed within an oxygen ambient at a high temperature exceeding 500° C.

Figure 14E:
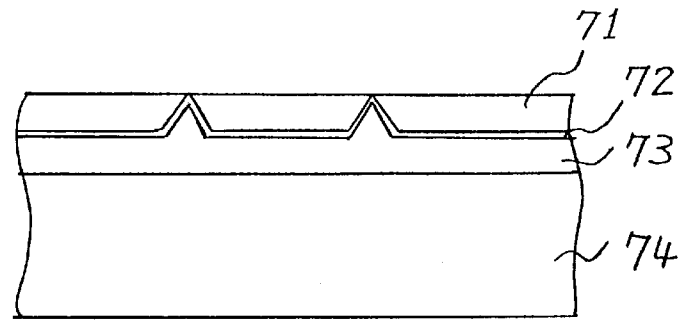
Figure 15:
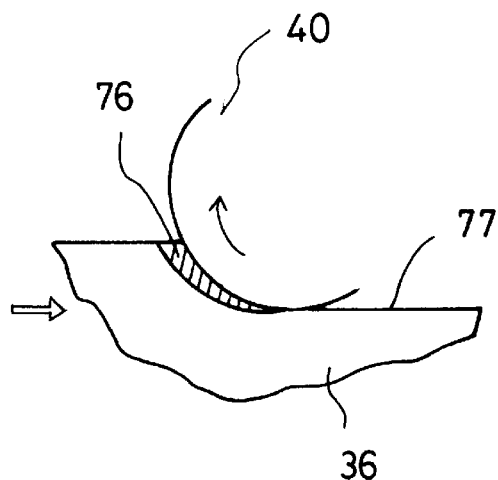
FIG. 15 is a fragmentary cross section, illustrating a mechanical grinding method using a cylindrical grinding wheel according to the invention.

Then, the first substrate 71 is ground until the front ends of the V-grooves are exposed by the aforementioned mechanical grinding illustrated in FIG. 10, i.e., until the state shown in FIG. 14E is obtained. Semiconductor devices in which the single crystal is dielectrically isolated into islands can be fabricated by this method. The semiconductor devices are formed in or on the single-crystal silicon.

In the step of FIG. 14B, the workpiece consists only of the polysilicon film 73. Even where the surface to be flattened consists of more than one substance, the surface can be readily planarized by the grinding method shown in FIG. 10. That is, if the flattened surface is a film consisting of plural materials such as a silicon film plus a silicon oxide film, then other substrate can be bonded to the planarized surface.

An example of method of fabricating semiconductor thin-film substrates according to the present invention is described below by referring to the accompanying drawings.

Figure 16A:
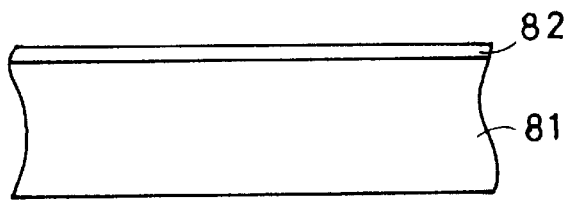
FIGS. 16A–16D are cross-sectional views of semiconductor thin-film substrates according to an eighth example of the invention, illustrating the process sequence.
Figure 16B:
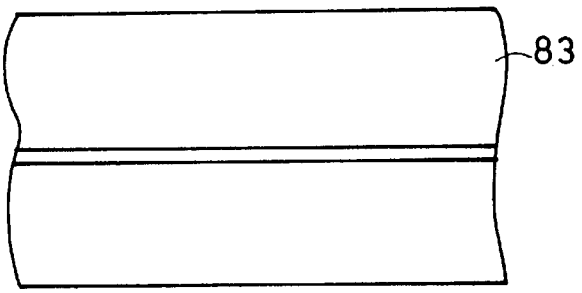
Figure 16C:
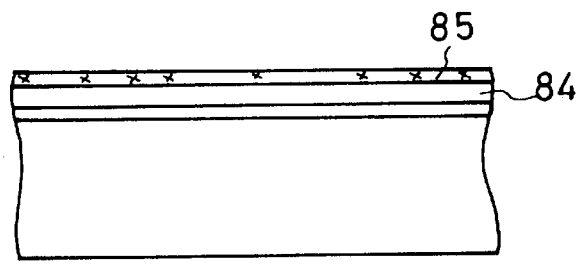

FIGS. 16A–16D are cross-sectional views of semiconductor thin-film substrates, illustrating the process sequence of an eighth example of the present invention. As shown in FIG. 16A, the surface of a silicon substrate 81 is thermally oxidized to form a silicon oxide film 82 on the surface. Then, as shown in FIG. 16B, a single-crystal silicon substrate 83 that is a second substrate is bonded to the silicon oxide film. The laminate is heated to a high temperature in excess of 500° C. so that atoms are bonded together at the contact surface. In this way, the bond strength is enhanced. Thereafter, as shown in FIG. 16C, the single-crystal silicon substrate 83 is ground by mechanical means already described in conjunction with FIG. 10, thus machining the single-crystal silicon substrate 83 into a single-crystal silicon thin film 84. In this machining method, the film thickness variation can be reduced below 0.1 $\mu$m or below 0.05 $\mu$m, irrespective of the film thickness of the single-crystal silicon, as previously described in the third example.

Figure 16D:
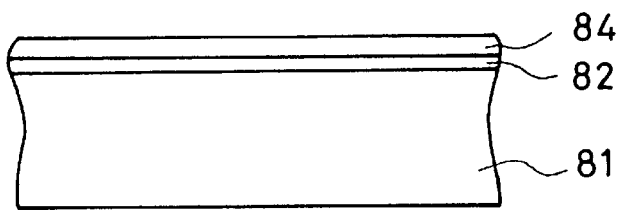

The single-crystal silicon thin film thinned by the mechanical processing means described thus far permits the film thickness variation to be decreased down to about 0.1 $\mu$m where the size of the substrate is 8 inches. That is, the unevenness can be reduced down to approximately 0.1 $\mu$m. Furthermore, the thickness of the modified layer 85 on the surface of the single-crystal silicon thin film 84 produced by the mechanical means can be decreased below 0.1 $\mu$m. Then, the modified layer 84 is etched away by silicon wet etching using HF+NHO$_3$ or the like. Subsequently, the silicon thin-film surface is polished into a mirror-like surface. Thus, an SOI substrate as shown in FIG. 16D can be obtained.

In the method of fabricating semiconductor thin-film substrates according to the present invention, the thickness of the layer modified in property by processing can be reduced below 0.1 $\mu$m. Therefore, it is necessary to remove only a small amount of silicon by etching in order to remove the modified layer. Consequently, the thickness of the single-crystal silicon thin film can be readily decreased below 0.5 $\mu$m. The present invention permits fabrication of SOI substrates having thicknesses of 0.05 to 0.3 $\mu$m which have been difficult to manufacture by the prior art techniques. SOI substrates of 0.05 to 0.3 $\mu$m can be manufactured by optimizing the manufacturing conditions. The modified layer which is ground can be made as thin as about 0.05 to 0.1 $\mu$m. Since the silicon film thickness reduced by the polishing step is very small, the single-crystal silicon thin film 84 including the modified layer as shown in FIG. 16C may be made thicker by taking account of the thickness of the modified layer 85 included in the thickness of the thin-film of the finished substrate shown in FIG. 16D.

Figure 17A:
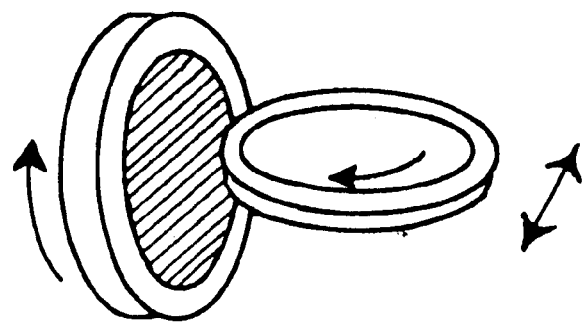
FIGS. 17A–17D are perspective views of semiconductor thin-film substrates according to the eighth example of the invention, illustrating the process sequence.
Figure 17B:
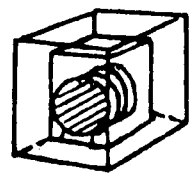
Figure 17C:
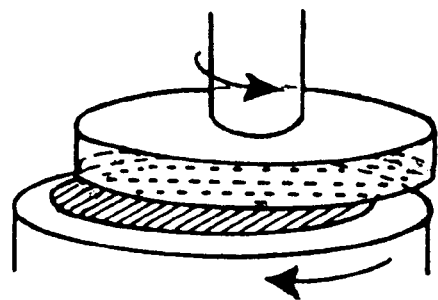
Figure 17D:
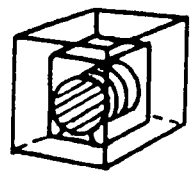

FIGS. 17A–17D are perspective views, permitting one to easily understand the process sequence of the novel thin-film substrate fabrication method. After bonding together two substrates, the second substrate is thinned as shown in FIG. 17A. Then, as shown in FIG. 17B, the modified layer produced by processing is removed by silicon wet etching. As shown in FIG. 17C, the surface is then polished. Thereafter, the surface of the silicon thin film is slightly etched away, as shown in FIG. 17D, thus completing the thin-film substrate.

FIGS. 18A-18B are cross-sectional views of semiconductor thin-film substrates according to a ninth example of the invention, illustrating the process sequence. In the ninth example, the first substrate is made of quartz which is an insulator. First, as shown in FIG. 18A, a single-crystal silicon substrate 92 is thermally bonded to the surface of a quartz substrate 91. Then, manufacturing steps similar to the steps shown in FIGS. 16A–16D are performed to form a quite thin single-crystal silicon film 93 having a thickness of less than 0.2 $\mu$m on the surface of the quartz substrate 91, as shown in FIG. 18B. This laminate having the thin single-crystal silicon film 93 on the quartz substrate 91 is transparent and thus adapted for a display device.

FIGS. 19A-19B are cross-sectional views of thin-film microcircuits according to a tenth example of the invention, illustrating the process sequence. First, as shown in FIG. 19A, an N-type single-crystal silicon substrate 94 having a dopant concentration of less than $10^{13}$ atoms/cm$^3$ is used as a first substrate. A P-type single-crystal silicon substrate 95 having a dopant concentration of more than $10^{18}$ atoms/cm$^3$ is directly bonded as a second substrate to the first substrate. For this purpose, the native oxide film on each substrate is required to be removed. For example, this removing step is carried out by bonding together the silicon surfaces with hydrogen. Furthermore, the bonding step is carried out in an ultrahigh vacuum. The temperature used during the bonding step is lower than 600° C. Since the temperature is very low, the impurity distribution at the P$^+$N$^-$ coupling varies in a stepwise fashion. Then, the P$^+$ substrate is thinned in the same way as in the processes illustrated in FIGS. 16A–16D. In this way, a PN bonded device having the P$^+$ single-crystal silicon thin film having a thickness of less than 0.1 $\mu$m can be formed, as shown in FIG. 19B. Since the thickness of the P$^+$ silicon film of these devices can assume a very small value of 0.1 $\mu$m, they are adapted for high-efficiency photodiodes and solar cells.

We summarize the invention as follows.

(1). A grinding machine comprises a cylindrical grinding wheel having a thickness of more than 10 mm, a grinding wheel shaft for rotating said cylindrical grinding wheel about an axis of rotation, a grinding wheel-moving means for reciprocating said grinding wheel shaft in a direction, a main spindle for rotating a disklike workpiece about an axis of rotation perpendicular to said direction of reciprocation and also to said axis of rotation of said cylindrical grinding wheel, and an infeed means for moving at least one of said workpiece and said cylindrical grinding wheel so that said cylindrical grinding wheel is fed into said workpiece.

(2). The grinding machine of the above (1), wherein the axis of rotation of said cylindrical grinding wheel is perpendicular to said direction of reciprocation.

(3). The grinding machine of the above (2), wherein said cylindrical grinding wheel is so located that center position taken in direction of thickness of said cylindrical grinding wheel has been shifted from a center of rotation of said workpiece along said axis of rotation of said cylindrical grinding wheel by a distance less than half of said thickness.

(4). The grinding machine of the above (1), wherein said infeed means is equipped with a controlled magnetic bearing mounted in at least one of said grinding wheel shaft and said main spindle, and wherein said cylindrical grinding wheel is fed into said workpiece by varying a position at which the shaft is held by said magnetic bearing.

(5). The grinding machine of the above (1), further comprising a storage means in which data about topology of a surface of said workpiece including unevenness is stored and a contact position detection means for detecting a position at which said cylindrical grinding wheel makes contact with the surface of said workpiece, and wherein said infeed means controls an amount of infeed of said cylindrical grinding wheel according to the unevenness of said surface of said workpiece at the position detected by said contact position detection means, said unevenness being contained in the data stored in said storage means.

(6). The grinding machine of the above (5), wherein said contact position detection means detects said contact position by measuring an angular position of said workpiece and a position of said cylindrical grinding wheel when it is reciprocating.

(7). A grinding method comprising the steps of, rotating a cylindrical grinding wheel having a thickness of more than 10 mm about a grinding wheel shaft, clamping a disklike workpiece to a support base bringing a surface of said workpiece into contact with a curved side surface of said cylindrical grinding wheel, rotating said support base to rotate said workpiece, and bringing contact portions of said workpiece and said cylindrical grinding wheel relative to each other in two dimensions along the surface of said workpiece, thus cutting the surface of said workpiece.

(8). A method of fabricating semiconductor devices, comprising the steps of forming a first thin film having convex portions on a surface of a substrate, patterning said first thin film by a photoetching method, forming a second thin film having recessed portions on the surface of said substrate such that said recessed portions are higher than said convex portions of said first thin film, and grinding said second thin film at least to a depth of said recessed portions of the second thin film by mechanical means.

(9). A method of fabricating semiconductor devices as set forth in the above (8), wherein said first thin film is made from a single-crystal silicon material, said second thin film is formed from a transistor-isolating dielectric film, and transistors are formed in or on said first thin film.

(10). A method of fabricating semiconductor devices as set forth in the above (8), wherein said first thin film is made from a first conductive film for forming conductive interconnections, said second thin film is made from a dielectric film for electrically isolating the interconnections, contact holes are formed in said second thin film on said first thin film, and a second conductive film is formed via said contact holes.

(11). A method of fabricating semiconductor devices as set forth in the above (8), wherein said second thin film is made from a ferroelectric film.

(12). A method of fabricating semiconductor devices, comprising the steps of forming unevenness on a surface of a first substrate, forming a thin film having recessed portions on the surface of said first substrate such that said recessed portions are higher than the surface of said first substrate, planarizing said surface of said thin film only by mechanical means, and adhesively bonding a second substrate to said planarized thin film.

(13). A method of fabricating semiconductor devices as set forth in the above (12), wherein the planarized surface of said thin film consists of a plurality of dissimilar materials.

(14). A method of fabricating a semiconductor thin-film substrate, comprising the steps of preparing a first substrate, adhesively bonding a second substrate made from a single-crystal semiconductor material to said first substrate, machining said second thin film into a semiconductor thin film by mechanical means, leaving behind a layer modified in property by the machining, removing a surface of said semiconductor thin film to a depth of 0.05 to 0.3 $\mu$m so as to remove the modified layer, and planarizing the uneven surface of said semiconductor thin film.

(15). A method of fabricating a semiconductor thin-film substrate as set forth in the above (14), wherein said first substrate is any one of a semiconductor substrate, an insulating substrate, and a semiconductor substrate having a dielectric film on its surface.

(16). A method of fabricating a semiconductor thin-film substrate as set forth in the above (14), wherein during said step of machining said second thin film into a semiconductor thin film by mechanical means, said semiconductor thin film has a thickness of less than 0.5 μm.

(17). A method of fabricating a semiconductor thin-film substrate as set forth in the above (14), wherein said mechanical means comprises the steps of rotating said second substrate along the surface of said second substrate, and rotating a disklike grinding wheel along a surface of said grinding wheel and reciprocating said grinding wheel relative to said surface of said second substrate such that plane of rotation of said second substrate is perpendicular to plane of rotation of said grinding wheel and that said second grinding wheel provides a point or line in contact with the surface of said second substrate, whereby grinding the whole surface of said second substrate.

With the novel grinding machine, grinding processing can be performed while suppressing formation of a layer modified in property by the grinding without involving increase of size of the machine or deterioration of the machining efficiency. Furthermore, with the novel grinding method, grinding processing producing only a thin layer modified by the processing can be accomplished. Moreover, with the novel semiconductor device fabrication method, semiconductor devices having multiple levels of metallization, high-density interconnections, dielectric isolation, fine-line pattern of ferroelectric film, and bonded wafers can be readily manufactured. In addition, with the novel semiconductor single-crystal thin-film fabrication method, flat single-crystal thin films having a thickness of less than 0.3 μm can be formed at a high accuracy of film thickness without depending on the underlying substrates.

What is claimed is:

1. A grinding machine comprising:
a grinding wheel having a thickness greater than 10 mm and an outer contact surface extending in a thickness direction of the grinding wheel for contacting a workpiece; a grinding wheel shaft for rotating the grinding wheel about a first rotational axis; moving means for reciprocating the grinding wheel shaft along a first displacement axis; a main spindle for rotating a workpiece about a second rotational axis perpendicular to the first displacement axis and the first rotational axis; and infeed means for moving at least one of the workpiece and the grinding wheel along a second displacement axis to bring the outer contact surface of the grinding wheel into linear contact with the workpiece to grind the workpiece, the linear contact having a contact length greater than 10 mm.

2. A grinding machine according to claim 1; wherein the first rotational axis is perpendicular to the first displacement axis.

3. A grinding machine according to claim 1; wherein the infeed means includes a magnetic bearing for floatingly supporting at least one of the grinding wheel shaft and the main spindle, the grinding wheel being brought into contact with the workpiece by varying a position at which the grinding wheel shaft or the main spindle is supported by the magnetic bearing.

4. A grinding machine according to claim 3; wherein grinding wheel is generally cylindrical-shaped.

5. A grinding machine according to claim 1; wherein the thickness of the cylindrical grinding wheel is 15 to 20 mm.

6. A grinding machine according to claim 1; wherein the first rotational axis is perpendicular to the first displacement axis.

7. A grinding machine according to claim 1; wherein grinding wheel is generally cylindrical-shaped.

8. A grinding machine comprising: a grinding wheel having a predetermined thickness; a grinding wheel shaft for rotating the grinding wheel about a first rotational axis; moving means for reciprocating the grinding wheel shaft along a first displacement axis; a main spindle for rotating a workpiece about a second rotational axis perpendicular to the first displacement axis and the first rotational axis; and infeed means for moving at least one of the workpiece and the grinding wheel along a second displacement axis to bring the grinding wheel into contact with the workpiece to grind the workpiece; wherein during grinding of the workpiece, a center of the grinding wheel in a thickness direction thereof is shifted from the second rotational axis by a distance equal to less than half of the thickness of the grinding wheel.

9. A grinding machine according to claim 8; wherein grinding wheel is generally cylindrical-shaped.

10. A grinding machine according to claim 9; wherein the thickness of the grinding wheel is greater than 10 mm.

11. A grinding machine according to claim 8; wherein the thickness of the grinding wheel is 15 to 20 mm.

12. A grinding machine comprising: a grinding wheel having a predetermined thickness; a grinding wheel shaft for rotating the grinding wheel about a first rotational axis; moving means for reciprocating the grinding wheel shaft along a first displacement axis; a main spindle for rotating a workpiece about a second rotational axis perpendicular to the first displacement axis and the first rotational axis; infeed means for moving at least one of the workpiece and the grinding wheel along a second displacement axis to bring the grinding wheel into contact with the workpiece to grind the workpiece; storage means for storing topology data corresponding at least to the unevenness of a surface of the workpiece; and contact position detection means for detecting a position at which the grinding wheel contacts the surface of the workpiece; wherein the infeed means controls an amount of infeed of the grinding wheel according to the unevenness of the surface of workpiece stored in the storage means at the position detected by the contact position detection means.

13. A grinding machine according to claim 12; wherein the contact position detection means detects the contact position by measuring an angular position of the workpiece and a position of the grinding wheel during reciprocation thereof.

14. A grinding machine according to claim 13; wherein grinding wheel is generally cylindrical-shaped.

15. A grinding machine according to claim 13; wherein the thickness of the grinding wheel is greater than 10 mm.

16. A grinding machine according to claim 12; wherein grinding wheel is generally cylindrical-shaped.

17. A grinding machine according to claim 16; wherein the thickness of the grinding wheel is greater than 10 mm.

18. A grinding machine according to claim 17; wherein the grinding wheel has an outer contact surface extending in the thickness direction of the grinding wheel for contacting the workpiece; and wherein the infeed means brings the outer contact surface of the grinding wheel into linear contact with the workpiece to grind the workpiece, the linear contact having a contact length greater than 10 mm.

19. A grinding machine according to claim 12; wherein the thickness of the grinding wheel is 15 to 20 mm.

20. A grinding machine comprising: a grinding wheel having a predetermined thickness and an outer contact surface extending in the thickness direction of the grinding wheel for contacting a workpiece; a grinding wheel shaft for rotating the grinding wheel about a first rotational axis; moving means for reciprocating the grinding wheel shaft along a first displacement axis; a main spindle for rotating the workpiece about a second rotational axis perpendicular to the first displacement axis and the first rotational axis; and infeed means for moving at least one of the workpiece and the grinding wheel along a second displacement axis to bring the contact surface of the grinding wheel into linear contact with the workpiece to grind the workpiece; wherein during grinding of the workpiece, a center of the grinding wheel in a thickness direction thereof is shifted from the second rotational axis by a distance equal to less than half of the thickness of the grinding wheel.

21. A grinding machine according to claim 20; wherein the thickness of the grinding wheel is greater than 10 mm; and wherein the linear contact between the contact surface of the grinding wheel and the workpiece has a contact length greater than 10 mm.

22. A grinding machine according to claim 21; wherein the grinding wheel is generally cylindrical-shaped.

23. A grinding machine comprising: a grinding member having an outer contact surface extending in a thickness direction of the grinding member for contacting a surface of a workpiece; a first rotational member for rotating the grinding member about a first rotational axis; a first moving mechanism for reciprocating the grinding member along a first displacement axis; a second rotational member for rotating the workpiece about a second rotational axis perpendicular to the first displacement axis and the first rotational axis; a second moving mechanism for moving at least one of the workpiece and the grinding member along a second displacement axis to bring the outer contact surface of the grinding member into contact with the workpiece to grind the surface of the workpiece; a storage device for storing topology data representative of at least the shape of the surface of the workpiece; and a position detection device for detecting a position at which the outer contact surface of the grinding member contacts the surface of the workpiece; wherein the second moving mechanism controls an amount of movement of the workpiece or the grinding member according to the shape of the surface of the workpiece at the position detected by the position detection device obtained from the topology data stored in the storage device.

24. A grinding machine according to claim 23; wherein during grinding of the workpiece, a center of the grinding member in the thickness direction thereof is shifted from the second rotational axis by a distance equal to less than half of the thickness of the grinding member.

25. A grinding machine according to claim 23; wherein the grinding member has a thickness greater than 10 mm; and wherein the second moving mechanism brings the outer contact surface of the grinding member into linear contact with the surface of the workpiece to grind the workpiece, the linear contact having a contact length greater than 10 mm.

26. A grinding machine according to claim 23; wherein the grinding member has a thickness of 15 to 20 mm.

27. A grinding machine according to claim 23; wherein the position detection device detects the contact position by measuring an angular position of the workpiece and a position of the grinding member during reciprocation thereof.

28. A grinding machine according to claim 23; wherein the second moving mechanism comprises a magnetic bearing device for floatingly supporting the first rotational member; and wherein the grinding member is moved by the first moving mechanism along the first displacement axis by varying a position at which the first rotational member is supported by the magnetic bearing device.

29. A grinding machine according to claim 23; wherein the second moving mechanism comprises a magnetic bearing device for floatingly supporting the second rotational member; and wherein the workpiece is moved by the second moving mechanism along the second displacement axis by varying a position at which the second rotational member is supported by the magnetic bearing device.

* * * * *